(12) United States Patent
Clemow

(10) Patent No.: US 6,208,687 B1
(45) Date of Patent: Mar. 27, 2001

(54) FILTER SWITCHING METHOD

(75) Inventor: Richard David Clemow, Gerrards Cross (GB)

(73) Assignee: Central Research Laboratories, Limited, Middlesex (GB)

( * ) Notice: Subject to any disclaimer, the term of this patent is extended or adjusted under 35 U.S.C. 154(b) by 0 days.

(21) Appl. No.: 09/171,366

(22) PCT Filed: Apr. 4, 1997

(86) PCT No.: PCT/GB97/00954

§ 371 Date: May 4, 1999

§ 102(e) Date: May 4, 1999

(87) PCT Pub. No.: WO97/39526

PCT Pub. Date: Oct. 23, 1997

(30) Foreign Application Priority Data

Apr. 16, 1996 (GB) .................................................. 9607863

(51) Int. Cl.[7] .................................................. H04B 15/00
(52) U.S. Cl. .................... 375/232; 375/350; 708/301; 708/319; 708/322
(58) Field of Search .................................................. 375/232, 350; 708/301, 319, 322

(56) References Cited

U.S. PATENT DOCUMENTS 5,381,357 * 1/1995 Wedgwood et al. ............ 364/724.16
6,032,171 * 2/2000 Kiriaki et al. ....................... 708/819

FOREIGN PATENT DOCUMENTS

0135024A2 3/1985 (EP) .
0135066A2 3/1985 (EP) .

OTHER PUBLICATIONS

International Search Report, Jul. 7, 1997.

* cited by examiner

Primary Examiner—Amanda T. Le
(74) Attorney, Agent, or Firm—Evenson, McKeown, Edwards & Lenahan, P.L.L.C.

(57) ABSTRACT

A filter apparatus (1) has a digital FIR filter (8) divided into two or more sections (6, 12) with means (18, 20, 22, 24, 26, 40) for varying the filter function of each section (6, 12). The filter (1) has an input switch (2,4) and an output switch (28, 30,32) which includes a fader (28, 30, 32) to enable one or more section (6, 12) to be switched out of circuit without disrupting the passage of signals to be filtered through the other section or sections (6, 12) of the filter (8). The filter function of each section (6, 12) is adjustable when the section (6,12) is switched out of circuit.

25 Claims, 1 Drawing Sheet

FILTER SWITCHING METHOD

BACKGROUND AND SUMMARY OF THE INVENTION

This invention relates to digital Finite Impulse Response filters, where it is required to change the filter transfer function without interrupting the passage of a desired signal through the filter.

Finite Impulse Response Filters (referred to herein as FIR filters) are very well known and commonly comprise a tapped delay line, or its digital equivalent, with the signal from each tapping being scaled or multiplied by a respective coefficient, and the tapped signals being combined to produce an output signal. Digital FIR filters can be implemented on programmable hardware (e.g. Digital Signal Processor (DSP) chips), or on dedicated hardware.

There is a common requirement for example in the audio industry for signals to run continuously through a circuit while characteristics or transfer functions of FIR filters therein are changed; audio signals must not be interrupted as this would cause clicks or other artefacts for a listener.

For the purposes of the present specification, it is to be understood that the changing of at least one coefficient in a first FIR and the consequent changing of the filter transfer function effectively produces a second FIR with a different transfer function, and reference herein to first and second FIR filters is to be construed, where appropriate, accordingly.

Where an FIR filter function is to be changed without interruption to the signals flowing through the system, known/obvious methods for doing this are as follows:

1) Suddenly update all the filter coefficients within one clock cycle of the system.
2) Crossfade each filter coefficient to its new value over several system clock cycles, doing this simultaneously for all filter coefficients
3) Implement a second physically separate FIR filter in parallel with the first, then crossfade between the outputs of the two filters, taking several system clock cycles to do so
4) Update the filter coefficients at a slower rate, one by one An example of one such method in which successive interpolated co-efficients are switched in to change the so-efficients of a filter from an initial set of co-efficients to a final set of co-efficients is described in European Patent 0135 066. However such a method does not bring about a smooth switching between filter functions.

Each of these methods has disadvantages. (1) causes a sudden change in the filter output which is generally undesirable. In the case of audio, this is usually heard as a click. (2) is the equivalent of (1), except that the transition to the new filter is performed more gradually to avoid the sudden transition in filter output. The disadvantage of this method is that a new set of filter coefficients has to be calculated (or stored in a look-up table) for each of the intermediate steps. This requires additional processing power or storage. Processing power is a valuable resource and additional processing power is often not available. (3) is functionally equivalent to (2) but still requires additional processing power to implement the second physically separate filter in parallel with the first. (4) is undesirable as the impulse response and hence frequency response of the filter is altered in a somewhat unpredictable way as each filter coefficient is updated.

It is an object of the present invention to provide a method of switching between first and second digital FIR filters without creating significant disturbance in a signal passing through the filters, and wherein the requirements of processing power to effect the change are reduced.

The invention relies on the fact that, in most real applications, most of the energy of a FIR filter is concentrated towards the front of the filter (or it can be designed to achieve this). A half-length filter, with only half of the number of coefficients, is therefore a good approximation to the full-length filter and a crossfade from the full-length filter to the half-length filter is quite easy to disguise. Although the half-length filter may not be accurate enough for continuous use, it is usually accurate enough to be used for the short tune it takes to crossfade to a second half-length filter with a different transfer function. Thus the filter switching is broken down into a number of steps, each step requiring a smaller amount of processing power than heretofore required.

According to one aspect of the present invention there is provided a method of switching between first and second digital FIR filters while permitting uninterrupted passage of a desired signal therethrough, the method including:

a) dividing a first filter into a plurality of sections,
b) rendering all but the fist section of the first filter inoperative by fading out their output,
c) changing the coefficients of an inoperative section of the first filter to the coefficients of a first section of a second filter, which is similarly divided into a like plurality of sections, and
d) conducting the desired signal through the first section of the second filter while rendering the first section of the first filter inoperative by fading out its output signal.

Preferably the method of the present invention includes the following steps.

1) The first filter A is initially being computed. The half-length filter consisting of the first half of filter A (referred to as A1) is computed in parallel. This requires no additional processing power as A1 is computed as part of filter A in any case. A crossfade between the outputs of filters A and A1 is performed over a number of system clock cycles. Filter A1 is now running, using only half the available processing power.
2) A half-length version of the second filter (B1) is computed in parallel with A1, using up the remaining processing power. A crossfade between the outputs Of filters A1 and B1 is performed over a number of system clock cycles, resulting in only filter B1 running, taking half the available processing power. This step can be repeated as many times as desired to switch through a number of filters C, D, etc.
3) The full-length filter B is now computed in parallel with B1. A crossfade from the output of B1 to the output of B is performed over a number of clock cycles. Filter B is now running.

The rates at which the crossfades are performed depends on the application. In some applications, a very fast crossfade, or even a sudden switch, may be satisfactory. In other applications, a slower crossfade may give better results. Also, the shape of the crossfade (linear or otherwise) can be varied to optimise results.

In subsequent steps, the changing of the second, and any further, filter sections will take place in a corresponding manner.

According to a further aspect of the there is provided a filter apparatus having an input terminal, an output terminal, a digital FIR filter comprising two or more sections each or which has a control means for setting the filter function of the respective section, an input switch means and an output fader means, said input switch means and said output fader means being constructed and arranged relative to the input terminal, the output terminal and each of the sections so as to be operable either to connect two or more sections in series between the input terminal and output terminal and thereby effectively form a fist FIR filter with a first filter function, or alternatively, to render inoperable one or more. Sections by fading out its output signal whilst leaving one or more sections connected in series between the input terminal and output terminal and thereby effectively form a second FIR filter with a second filter function without disrupting the passage of a signal through the filter apparatus from the input terminal to the output terminal, said control means being operable to change the filter function of the inoperable section or sections.

According to a further aspect of the present invention there is provided a digital FIR filter apparatus which is selectively changeable from a first digital FIR filter to a second digital FIR filter with a different filter function, while permitting uninterrupted passage of a signal there through to be filtered, the filter apparatus comprising at least first and second filter sections, each section comprising a series chain of delay elements with intermediate tapping points, and scaler elements with adjustable scaling coefficients being connected to respective tapping points, the outputs of the scalers being connected to a summing means, wherein the output of the first and second section summing means are coupled to respective first and second inputs of an output fader means for providing a filter output, and wherein an input terminal of the digital filter apparatus together with both ends of the series chains of both filter sections are selectively coupled together via an input switch means, whereby to permit the output of one filter section to be faded out white its scaling coefficients are changed, and for the series chains of the filter sections to be selectively connected in series, either chain being upstream of the other.

Preferably the output fader means comprises fader means, wherein the first and second inputs thereof are coupled to respective scalers having adjustable scaling coefficients, the outputs of the scaling means being coupled to a summing means to provide the filter output signal.

Whilst the filters of the present invention may be divided into any number of sections, the more sections that are provided, the longer is the overall switching time. It is therefore preferred to divide the filters into just two sections, preferably of equal length, or at least generally equal length, so that the processing power requirements are reduced by half, which is sufficient for most applications envisaged.

Whilst a simple switching in a single clock cycle is possible between the various filter sections, it is preferred to employ fading (crossfading) between the filter sections over a plurality of clock cycles in order to reduce the risk of disturbance to the signal being fed across the filters.

In this respect it is preferable that the input switch means comprises first and second two way switches each connected between the input terminal and selected ends of the series chains of the filter sections.

In a further aspect of the invention where there are two sections, the input terminal of the filter apparatus together with both ends of the series chains of delay elements of both sections are selectively coupled together via the input switch means whereby to permit one filter section either to be switched out of circuit while its scaling co-efficients are changed, the series chain of delay elements of the other filter section to be connected in series, between the input switch means and the output switch means or for the series chain of delay elements of either section to be connected in series upstream of the series chain of delay elements of the other chain.

One particular application envisaged for the present invention is that of audio sound reproduction with accurate location of the reproduced sound in three dimensions. This is commonly known as binaural reproduction. For "lo-fi" applications such as Arcade games, movement of a manually operable joystick may cause a change in the apparent position of a reproduced sound, e.g. an engine sound. In order to achieve this, a sound source may be recorded monophonically through a single microphone, and the recorder signal may be subjected to a pair of filters with known transfer functions in order to produce a binaural signal with the sound reproduced at a particular location. If the location is to be changed, then the filter transfer function is changed, in real time and in accordance with the present invention, to produce a second filter representing the sound at a further location. In such application, the filter may require significant processing power, and so the present invention avoids any additional processing power to effect the filter change.

BRIEF DESCRIPTION OF THE DRAWINGS

A preferred embodiment of the invention will now be described with reference to the accompanying drawings, wherein.

DESCRIPTION OF THE PREFERRED EMBODIMENT

Figure 1:
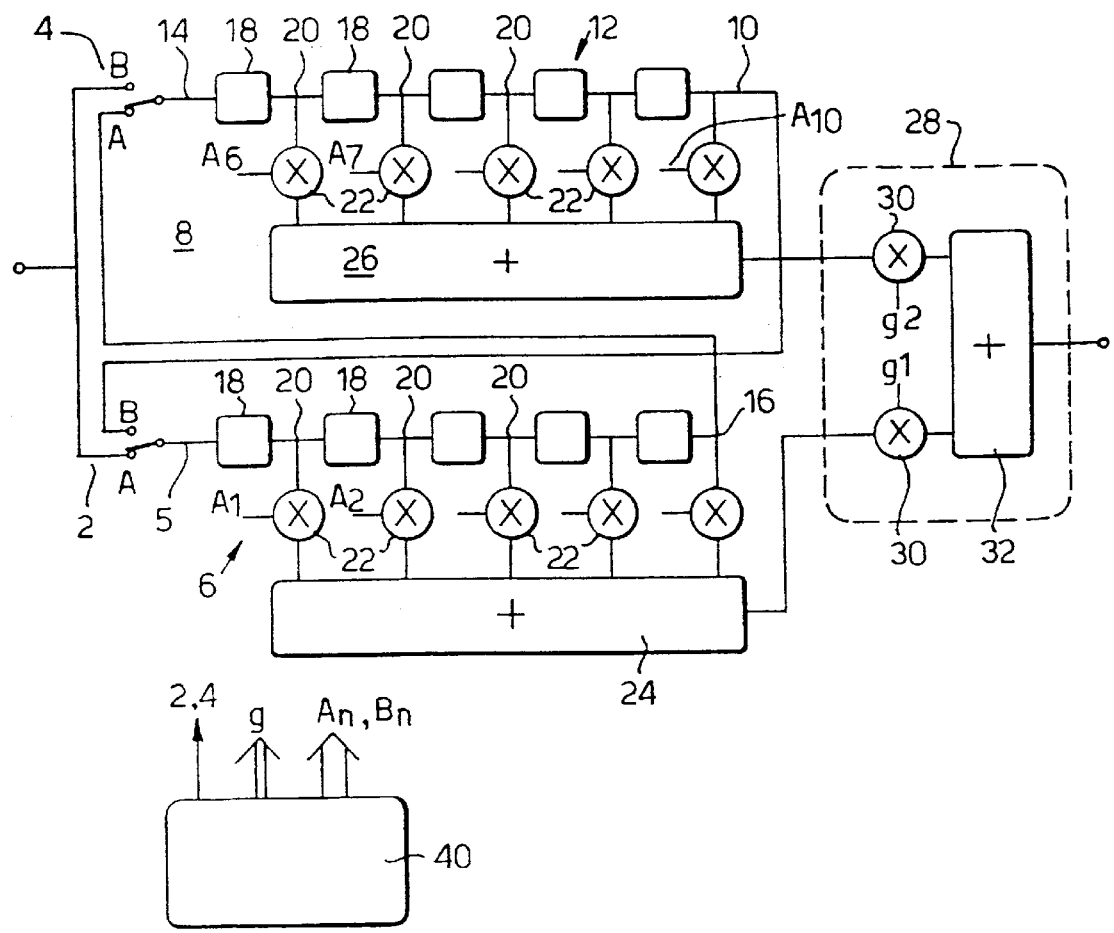
FIG. 1 is a block diagram of a digital FIR filter shown schematically as two sections of equal length, the sections being interconnected by two way switches.

In FIG. 1, the filter apparatus I comprises a signal input port INPUT is coupled to first and second two-way switches 2, 4 each having switch positions A, B. The switch 2 is selectively connected between the input 5 of a first section 6 of a ten tap digital FIR filter 8, and either to INPUT or to one end 10 of a second section 12 of the filter. The switch 4 is selectively connected between an input end 14 of second filter section 12, and either INPUT or an end 16 of first filter section 6.

Each filter section 6, 12 comprises in series five time delay elements 18 of a value equal to one system clock interval, with five respective tapping points 20 leading to five respective scalers 22 for multiplying the tapped signals by respective scaling coefficients $A_{1...10}$. The outputs of the scalers 22 are connected to respective summers 24, 26, with the output of summer 24 representing the output of the first section 6 and the output of summer 26 representing the output of second filter section 12. The two outputs are coupled to respective inputs of a crossfader 28 having scalers 30 in its input lines for multiplying the filter section output signals by respective variable coefficients g1, g2. The scaled signals are summed in a summer 32 to provide an output signal at an output terminal OUTPUT.

A processor 40 is coupled to scalers 22, 30 for providing desired scaling coefficients thereto, and to switches 2, 4 for effecting switching operations.

The method of the preferred embodiment is as follows:

Initially, both switches are in positions A, and crossfader coefficients g1 and g2 arc both set to 1. In this configuration, a first filter A is formed with filter section 6 forming the first filter section, and filter section 12 forming the second half of the filter. Since g1, g2 are both 1, the outputs of the two filter sections are summed via summers 24, 26 and 32 to provide a signal at OUTPUT. This is the usual configuration of the filter in many applications.

Step 1. Crossfader coefficient g2 is gradually reduced to 0 over several, say 10 system clock cycles, fading out the second filter section 12. The output is now the output of the first filter section 6. Thus first filter section 6 effectively forms a new filter, with a filter function approximating to the original.

Step 2. With the second filter section 12 now inoperative, the coefficients for scalers 22 can be changed without any affect on the throughput signal. The coefficients are changed to those $B_{1\ldots5}$ for the first half section of a second filter B. These coefficients may conveniently be stored in a memory or register store of processor 40. Switch 4 is moved to position B so that the first half of filter B receives the input signal, although it is still inoperative as g2 is set to zero. Crossfader coefficients g1 and g2 are gradually changed by processor 40 over say ten clock cycles from 1 and 0 respectively to 0 and 1 respectively, maintaining the relationship g1+g2=1 at all times. This crossfades from filter A to filter B (at least 5 clock cycles must be allowed before crossfading for filter 2 delay line to be filled).

This step may be repeated as many times as desired, alternately crossfading between filter 1 and filter 2 as each new half-length filter is used. This might be required for example where the function of the two filters are very different, and it is desired to go through intermediate filter steps in order to spread the filter function change over a long time period.

Step 3. With filter section 6 now inoperative, the coefficients of the filter may be changed without affecting the throughput signal, and processor 40 operates to substitute coefficients $B_{6\ldots10}$ (the second half of the second filter B) for the existing coefficients of filter section 6. Switch 2 is moved to position B. After at least 5 clock cycles to allow filter section 6 delay elements 18 to be filled, the crossfader coefficient g1 is gradually increased from 0 to 1. Thus with both coefficients g set to 1, and filter section 6 receiving the signal from the end of 10 of filter section 10, the filter now fully represents a second filter B with ten taps.

It will be appreciated that although the, above describes a filter 8 with tent taps, any number of taps may be employed, depending, on the desired filter function it is desired to implement.

Figure 2:
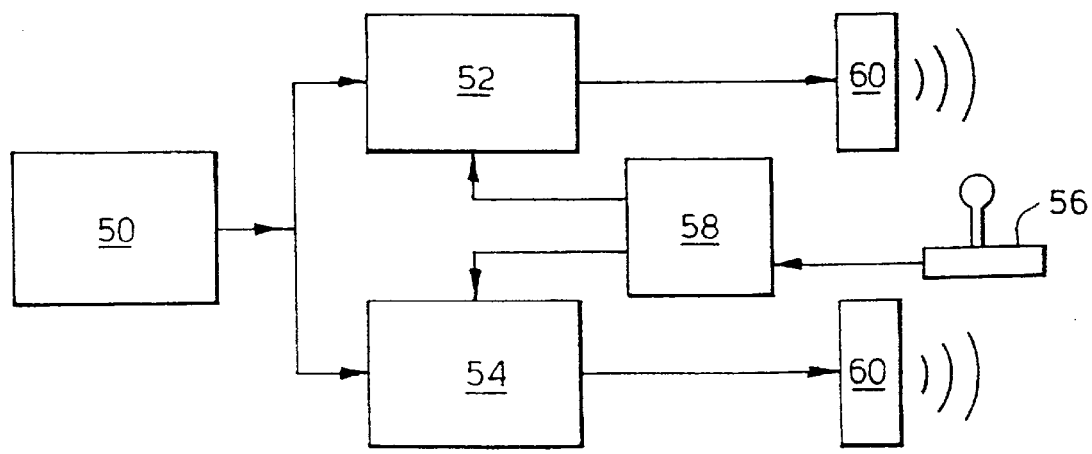
FIG. 2 is a schematic diagram of an application of the filter of FIG. 1 in a binaural sound reproduction system.

Referring now to FIG. 2, there is shown schematically a binaural sound reproduction system incorporated in an arcade game, wherein a recording of a monophonic sound source in ROM 50 is fed through two filters 52, 54, each of a configuration as shown in FIG. 1. A manually operable joy stick 56 provides input signals to a processor 58, such input signals being used to determine a desired position of sound occurring during the course of a game. Processor 58 is operative to translate these input signals into desired filter functions for filters 52, 54, which operate on the mono sound signal to produce on lines leading to loudspeakers 60, a pair of binaural signals which will reproduce the sound at a desired apparent position in three dimensional space in the environment of the game player. For increased accuracy, a cross-talk cancellation circuit (not shown) may be introduced for filtering the binaural signals to produce transaural sound signals with a very realistic impression of sound location.

What is claimed is:

1. A method of switching between first and second digital FIR filters (A,B) while permitting uninterrupted passage of a desired signal therethrough, the method including:

a) dividing a first filter (A) into a plurality of sections (6,12), b) rendering all but the first section (6) of the first filter (A) inoperative by fading out their output signals, c) changing the coefficients of an inoperative section (12) of the first filter (A) to the coefficients of a first section of a second filter (B), which is similarly divided into a like plurality of sections (6,12), and d) conducting the desired signal through the first section of the second filter while rendering the first section of the first filter inoperative by fading out its output signal.

2. A method according to claim 1, further including changing the coefficients of the inoperative first filter section (6) of the first filter (A) to the coefficients of a second (12) section of the second filter (B), and coupling the second section (12) of the second filter (B) to operate with the first section (6) of the second filter (B).

3. A method according to claim 2, wherein one or any of the aforesaid steps is carried out in a crossfading operation wherein the operative filter sections (6,12) are gradually changed over a plurality of system clock cycles.

4. A method according to claim 1, wherein one or any of the aforesaid steps is carried out in a crossfading operation wherein the operative filter sections (6,12) are gradually changed over a plurality of system clock cycles.

5. A filter apparatus having an input terminal, an output terminal, a digital FIR filter (1) comprising two or more sections (6,12) each of which has a control means (18,20,22) for setting the filter function of the respective section, an input switch means (24) and an output fader means (28,30, 32), said input switch means (24) and said output fader means (28,30,32) being constructed and arranged relative to the input terminal, the output terminal and each of the sections (6,12) so as to be operable either to connect two or more sections in series between the input terminal and output terminal and thereby effectively form a first FIR filter (A) with a first filter function, or alternatively, to render inoperable one or more, sections by fading out, its output signal whilst leaving one or more sections (6,12) connected in series between the input terminal and output terminal and thereby effectively form a second filter (B) with a second FIR filter function without disrupting the passage of a signal through the filter apparatus from the input terminal to the output terminal, said control means (18,20,22,24,26) being operable to change the filter function of the inoperable section or sections.

6. A filter apparatus according to claim 5 wherein the digital FIR filter comprises at least first and second filter sections (6,12), each section comprising a series chain of delay elements (18) with intermediate tapping points (20), and scaler elements (22) with adjustable scaling coefficients connected to respective tapping points (20), the outputs of the scalers (22) being connected to a respective summing means (24,26), and an output of the summing means (24,26) of each section (6,12) is coupled to a respective first or second input of the output fader means (28,30,32).

7. A filter apparatus according to claim 6 wherein there are two sections (6,12) and the input terminal of the filter means together with both ends of the series chains of delay elements (18) of both sections are selectively coupled together via the input switch means (2,4) whereby to permit one filter section (6,12) either to be switched out of circuit while its scaling, co-efficients are changed, the series chain of delay elements (18) of the other filter sections (6,12) to be connected in series, between the input switch means (2,4) and the output fader means (28,30,32) or for the series chain of delay elements (18) of either section to be connected in series upstream of the series chain of delay elements (18) of the other chain.

8. A filter apparatus according to claim 7 wherein the functions of said digital FIR filter represent transfer functions for producing binaural signals from a monophonic sound signal.

9. A filter apparatus according to claim 6 wherein the output fader (28,30,32) comprises a fader (28) having scaling elements (30) with adjustable scaling co-efficients coupled to an output of each section, said scaling elements (30) having outputs coupled to an input of a summing unit (32), and the summing unit (32) having an output connected to the output terminal of the filter.

10. A filter apparatus according to claim 6 wherein the FIR filter comprises two sections.

11. A filter apparatus according to claim 6 wherein the functions of said digital FIR filter represent transfer functions for producing binaural signals from a monophonic sound signal.

12. A filter apparatus according to claim 5 wherein the output fader means (28,30,32) comprises a fader means (28) having scaling means (30) with adjustable scaling co-efficients coupled to an output of each section, said scaling means (30) having outputs coupled to an input of a summing means (32), and the summing means (32) having an output connected to the output terminal of the filter means.

13. A filter apparatus according to claim 12 wherein the FIR filter comprises two sections.

14. A filter apparatus according to claim 12 wherein the functions of said digital FIR filter represent transfer functions for producing binaural signals from a monophonic sound signal.

15. A filter apparatus according to claim 5 wherein the FIR filter comprises two sections.

16. A filter apparatus according to claim 15 wherein the functions of said digital FIR filter represent transfer functions for producing binaural signals from a monophonic sound signal.

17. A filter apparatus according to claim 5 wherein the filter functions of said digital FIR filter represent transfer functions for producing binaural signals from a monophonic sound signal.

18. A digital FIR filter (1) apparatus which is selectively changeable from a first digital FIR filter to a second digital FIR filter with a different filter function, while permitting uninterrupted passage of a signal therethrough to be filtered, the filter apparatus (1) comprising at least first and second filter sections (6,12), each section comprising a series chain of delay elements (18) with intermediate tapping points (20), and scaler elements (22) with adjustable scaling coefficients being connected to respective tapping points (20), the outputs of the scalers (22) being connected to a summing means (24,26), wherein the output of the first and second section summing means (24,26) are coupled to respective first and second inputs of an output fader means (28,30,32) for providing a filter output, and wherein an input terminal of the digital filter apparatus (1) together with both ends of the series chains of both filter sections are selectively coupled together via an input switch means (24), whereby to permit the output of one filter section to be faded out while its scaling coefficients are changed, and for the series chains of the filter sections to be selectively connected in series, either chain being upstream of the other.

19. A filter apparatus having an input terminal, an output terminal, a digital FIR filter (1) comprising two or more sections (6,12) each of which has a control unit (18,20,22) for setting the filter function of the respective section, an input switch (24) and an output fader (28,30,32), said input switch (24) and said output fader (28,30,32) being constructed and arranged relative to the input terminal, the output terminal and each of the sections (6,12) so as to be operable either to connect two or more sections in series between the input terminal and output terminal and thereby effectively form a first FIR filter (A) with a first filter function, or to render inoperable one or more, sections by fading out, its output signal whilst leaving one or more sections (6,12) connected in series between the input terminal and output terminal and thereby effectively form a second filter (B) with a second FIR filter function without disrupting the passage of a signal through the filter apparatus from the input terminal to the output terminal, said control unit (18,20,22,24,26) being operable to change the filter function of the inoperable section or sections.

20. A filter apparatus according to claim 19 wherein the digital FIR filter comprises at least first and second filter sections (6,12), each section comprising a series chain of delay elements (18) with intermediate tapping points (20), and scaler elements (22) with adjustable scaling coefficients connected to respective tapping points (20), the outputs of the scalers (22) being connected to a respective summing unit (24,26), and an output of the summing unit (24,26) of each section (6,12) is coupled to a respective first or second input of the output fader (28,30,32).

21. A filter apparatus according to claim 20 wherein there are two sections (6,12) and the input terminal of the filter together with both ends of the series chains of delay elements (18) of both sections are selectively coupled together via the input switch (2,4) whereby to permit one filter section (6,12) either to be switched out of circuit while its scaling co-efficients are changed, the series chain of delay elements (18) of the other filter sections (6,12) to be connected in series, between the input switch (2,4) and the output fader (28,30,32) or for the series chain of delay elements (18) of either section to be connected in series upstream of the series chain of delay elements (18) of the other chain.

22. A filter apparatus according to claim 19 wherein the output fader (28,30,32) comprises a fader (28) having scaling elements (30) with adjustable scaling co-efficients coupled to an output of each section, said scaling elements (30) having outputs coupled to an input of a summing unit (32), and the summing unit (32) having an output connected to the output terminal of the filter.

23. A filter apparatus according to claim 19 wherein the FIR filter comprises two sections.

24. A filter apparatus according to claim 19 wherein the filter functions of said digital FIR filter represent transfer functions for producing binaural signals from a monophonic sound signal.

25. A digital FIR filter (1) apparatus which is selectively changeable from a first digital FIR filter to a second digital FIR filter with a different filter function, while permitting uninterrupted passage of a signal therethrough to be filtered, the filter apparatus (1) comprising at least first and second filter sections (6,12), each section comprising a series chain of delay elements (18) with intermediate tapping points (20), and scaler elements (22) with adjustable scaling coefficients being connected to respective tapping points (20), the outputs of the scalers (22) being connected to a summing unit (24,26), wherein the output of the first and second section summing units (24,26) are coupled to respective first and second inputs of an output fader (28,30,32) for providing a filter output, and wherein an input terminal of the digital filter apparatus (1) together with both ends of the series chains of both filter sections are selectively coupled together via an input switch (24), whereby to permit the output of one filter section to be faded out while its scaling coefficients are changed, and for the series chains of the filter sections to be selectively connected in series, either chain being upstream of the other.

* * * * *